(12) United States Patent
Tao

(10) Patent No.: US 6,683,259 B2
(45) Date of Patent: Jan. 27, 2004

(54) PRINTED CIRCUIT BOARD INCORPORATING ENHANCED CONDUCTIVE INK

(75) Inventor: Qi Tao, Holly, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 10/341,649

(22) Filed: Jan. 14, 2003

(65) Prior Publication Data

US 2003/0138610 A1 Jul. 24, 2003

Related U.S. Application Data

(60) Provisional application No. 60/353,604, filed on Jan. 23, 2002.

(51) Int. Cl.[7] .................................................. H05K 1/09
(52) U.S. Cl. ........................................ 174/257; 174/255
(58) Field of Search ................................. 174/256, 257, 174/255

(56) References Cited

U.S. PATENT DOCUMENTS

| | | | | |
|---|---|---|---|---|
| 4,045,636 A | * | 8/1977 | Yoder et al. ................. 200/292 |
| 4,835,038 A | * | 5/1989 | Kaneko et al. ............. 428/209 |
| 5,043,526 A | * | 8/1991 | Nakagawa et al. .......... 174/250 |
| 5,234,745 A | * | 8/1993 | Kawakami et al. ......... 428/209 |
| 5,270,493 A | * | 12/1993 | Inoue et al. ................. 174/253 |
| 5,298,687 A | * | 3/1994 | Rapoport et al. ........... 174/261 |
| 5,981,043 A | * | 11/1999 | Murakami et al. .......... 428/209 |

* cited by examiner

*Primary Examiner*—Cathy Lam

(57) ABSTRACT

A single-sided circuit board uses two types a conventional, conductive ink and an enhanced conductive ink having to form cross-over connections. The conductive ink, enhanced ink, and an insulating overcoat layer are arranged in various configurations to minimize moisture and/or a positive electric field in the conductive ink that could cause migration of particles in the conductive ink.

11 Claims, 2 Drawing Sheets

PRINTED CIRCUIT BOARD INCORPORATING ENHANCED CONDUCTIVE INK

REFERENCE TO RELATED APPLICATIONS

This application claims the benefit of U.S. Provisional Appln. No. 60/353,604, filed Jan. 23, 2002.

TECHNICAL FIELD

The invention relates to printed circuit boards, and more particularly to a printed circuit board that creates electrical connections with electrically conductive ink.

BACKGROUND OF THE INVENTION

Single-sided circuit boards with conductive jumpers or cross-overs are often used to increase the number of connections on the printed circuit board without resorting to more expensive double-side circuit boards. In a circuit having two conductive pads, or "vias" that are separated by conductive traces, the vias are connected together by first applying an electrically insulating undercoat layer on the traces, then applying electrically conductive ink onto the insulating layer to form a path connecting the vias. To protect the path, an insulating overcoat layer is applied on top of the conductive ink.

Although this structure does connect the vias, moisture and/or a positive electrical field across the conductive ink may cause the conductive ink to migrate, degrading the quality of the path and causing the conductive ink to even migrate through the undercoat and overcoat, creating undesirable short circuits. More particularly, any water in the undercoat or overcoat layer will polarize when exposed to an electrical field. If the electrical field is positive with respect to the undercoat or overcoat, particles from the conductive ink will travel through the undercoat/overcoat material, creating short circuits between the cross-over and nearby electrical contacts on the circuit board.

There is a desire for a circuit board structure that incorporates conductive ink cross-overs without experiencing migration problems.

SUMMARY OF THE INVENTION

The present invention is directed to a circuit board having cross-over structures incorporating two types of conductive ink: a conventional, conductive ink and an enhanced ink having enhanced properties to minimize or prevent migration of the conductive ink.

In one embodiment, the enhanced ink is applied directly on top of the conductive ink on an undercoat layer before applying the overcoat. The direct contact between the conductive ink and the enhanced ink causes the two inks to be at the same voltage potential, eliminating formation of a positive electrical field between the overcoat and the cross-over.

In another embodiment, the overcoat is sandwiched between the conductive ink and the enhanced ink, creating an improved moisture barrier on the overcoat. The enhanced ink may be formed into multiple traces, connecting the traces into one or more groups, and then tying each group to the highest voltage potential in the vicinity of the group. This ensures that the electric field between the conductive ink and the enhanced ink is either zero or negative, preventing migration of the conductive ink.

In yet another embodiment, the insulating material normally used to form the overcoat layer is eliminated and two layers of the enhanced ink are applied to the conductive ink as the overcoat. Because the lower layer of the enhanced ink contacts both the conductive ink and the upper enhanced ink layer, all three layers are at the same voltage potential, eliminating electrical fields in any of the layers.

By using the enhanced ink to eliminate moisture and/or positive electric fields around the conductive ink path, the invention prevents short circuits from occurring due to migration of the conductive ink through the undercoat and/or overcoat layers.

DETAILED DESCRIPTION OF THE EMBODIMENTS

The description below will reference two types of conductive inks: a "conductive ink," which can be any conventional conductive ink (e g., silver, copper, or other similar material mixed with a liquid adhesive), and an "enhanced ink," which is an ink having enhanced properties. In one embodiment, the enhanced ink is made with carbon and/or polytetrafluoroethylene (PTFE). Other materials instead of carbon and PTFE may also be used to form the enhanced ink. Regardless of the specific material used, the enhanced ink ideally should be non-migrating relative to metal, weakly conductive, moisture resistant, thermally resistant, and resistant to metal contamination. In one embodiment, the enhanced ink is less conductive than the conductive ink.

Figure 1:
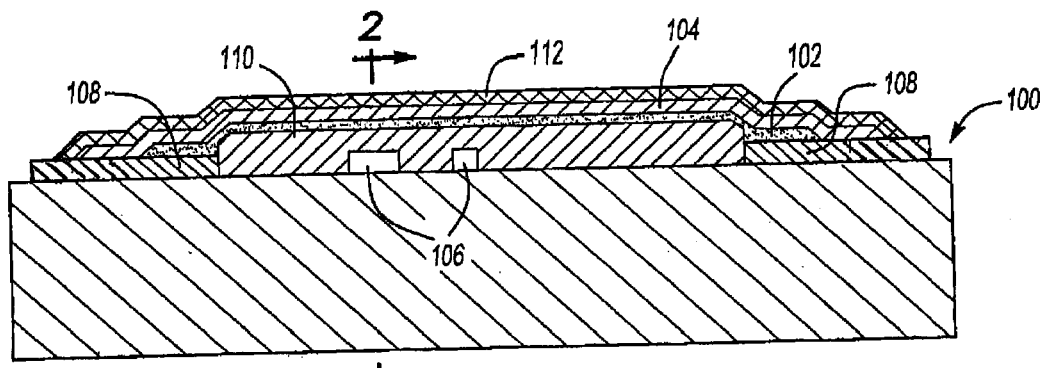
FIGS. 1 is a representative sectional diagram of a circuit board according to one embodiment of the invention.
Figure 2:
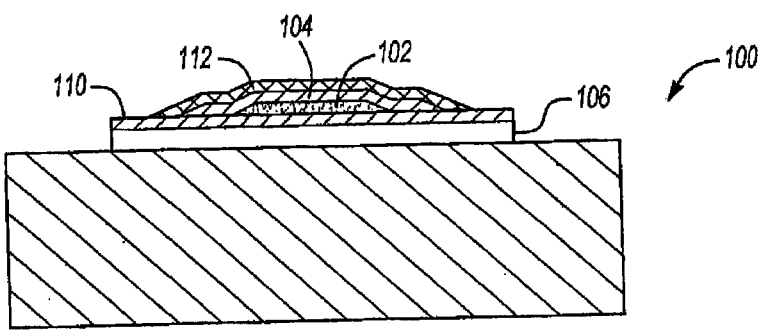
FIG. 2 is a cross-section of the board in FIG. 1 taken along line 2—2.

The conductive ink and the enhanced ink, along with other components in the printed circuit board, can be arranged in different ways to eliminate migration of the conductive ink. FIGS. 1 and 2 illustrate a circuit board 100 incorporating both conductive ink 102 and enhanced ink 104 according to one embodiment of the invention. In all of the embodiments described below, it is assumed that the circuit board 100 has one or more traces 106 and at least two vias 108. The invention focuses on connecting the vias 108 with a cross-over arranged above the traces 106. The vias 108 and traces 106 themselves can be made from any conductive material and can have any configuration.

As shown in FIGS. 1 and 2, the traces 106 are covered with an insulating undercoat layer 110 to protect the traces 106. A cross-over path is then drawn on the undercoat layer 110 with the conductive ink 102 to connect the vias 108. A layer of the enhanced ink 104 is then applied directly on top of the conductive ink 102, preferably extending beyond the edges of the conductive ink 102 to prevent moisture from reaching the edge of the conductive ink 102. An optional insulating overcoat layer 112 is then applied on top of the enhanced ink 102 to seal the entire layered structure.

In this embodiment, the conductive ink 102 is used to carry current between the vias 108, while the enhanced ink 104 establishes equal voltage potential between the conductive ink 102 and the enhanced ink 104. By eliminating any voltage potential difference between the overcoat 112, enhanced ink 104 and conductive ink 102, there is no electrical field in the conductive ink 102. As a result, there are no electrical forces on the conductive particles inside the conductive ink 102 that could cause ink migration.

Figure 3:
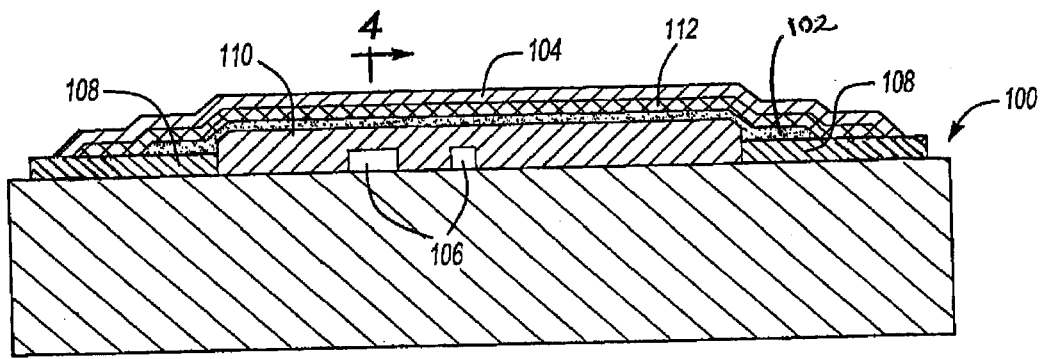
FIG. 3 is a representative sectional diagram of a circuit board according to another embodiment of the invention.
Figure 4:
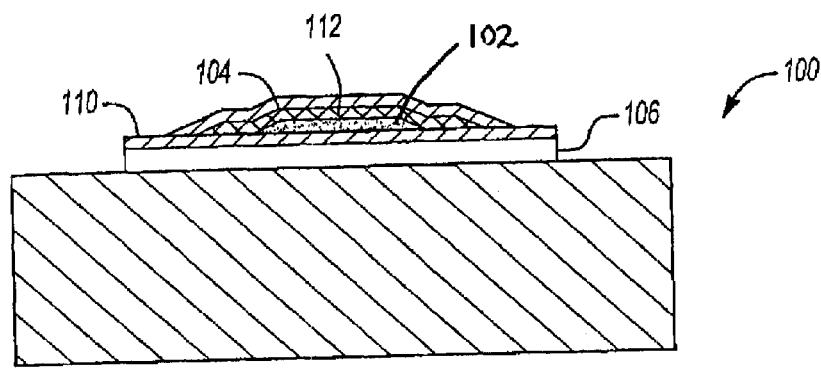
FIG. 4 is a cross-section of the board in FIG. 3 taken along line 4—4.

FIGS. 3 and 4 illustrate another embodiment of the invention. Like the previous embodiment, the undercoat 110 is applied over the traces 106 to protect the traces 106, and the conductive ink 102 is applied on the undercoat 110 to link the vias 108. In this embodiment, however, the overcoat 112 is applied on top of the conductive ink 102, with the enhanced ink 104 being applied on top of the overcoat 112. As a result, the overcoat 112, separates the conductive ink 102 and the enhanced ink 104 from each other.

In this embodiment, the enhanced ink 104 is left exposed; however, the enhanced ink 104 may be formulated to have better moisture resistance properties than the overcoat 112 material, prevent moisture from contacting the overcoat 112 altogether. This ensures that the overcoat 112 maintains its dielectric properties, preventing migration of the conductive ink 102 particles. For further protection, an optional second overcoat layer (not shown) may be applied on top of the enhanced ink 104 to prevent scratching of the enhanced ink 104 if the added thickness will not interfere with the board's 100 use.

Further, although this embodiment does allow a positive electric field to exist in the layered structure because of the voltage potential difference between the conductive ink 102 and the enhanced ink 104, the moisture barrier formed by applying the enhanced ink 104 on the overcoat 112 provides sufficient protection against migration of the conductive ink 102.

Note that in the embodiment shown in FIGS. 3 and 4, the enhanced ink 104 may be formed as multiple traces where groups of traces are connected together into one or more groups. Each group is then tied to the highest voltage potential in the vicinity of the group. This ensures that the electric field between the conductive ink 102 and the enhanced ink 104 is either zero or negative instead of positive at any given location on the board 100, preventing migration of the conductive ink 102.

Figure 5:
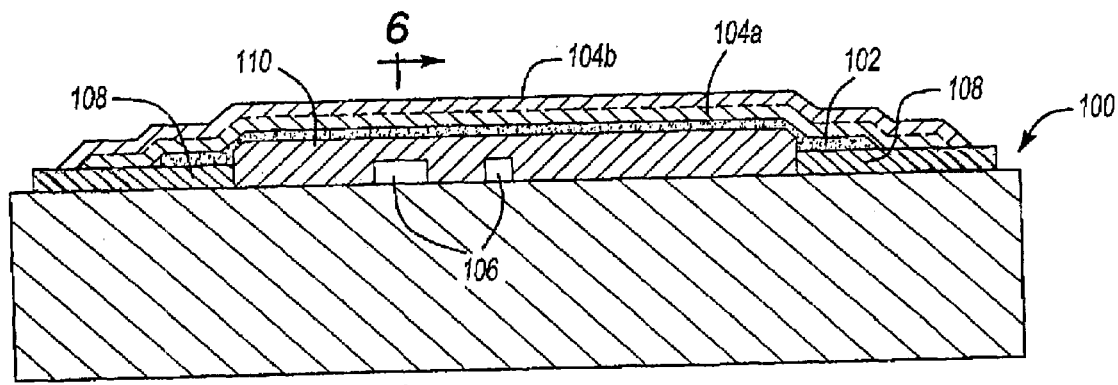
FIG. 5 is a representative sectional diagram of a circuit board according to a further embodiment of the invention.
Figure 6:
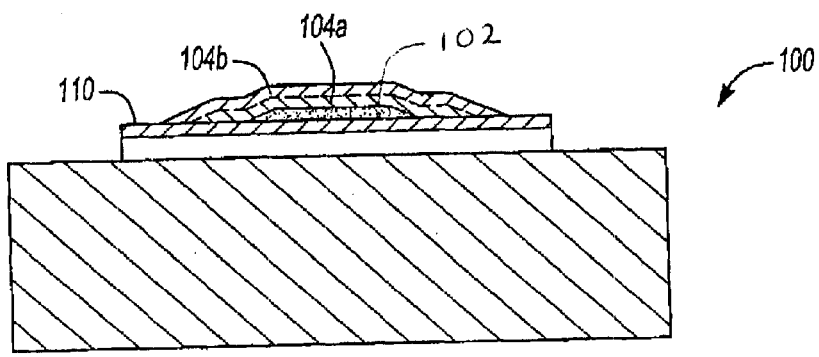
FIG. 6 is a cross-section of the board in FIG. 5 taken along line 6—6.

FIGS. 5 and 6 illustrate a further embodiment of the invention. This embodiment is a variation of the embodiment shown in FIGS. 1 and 2 except that the enhanced ink layer 104 is thicker. The extra thickness in the enhanced ink layer 104 allows the enhanced ink layer 104 to act as if it has a lower region 104a and an upper region 104b. The lower enhanced ink region 104a contacts the conductive ink 102 directly, causing the lower enhanced ink region 104a to have the same voltage potential as the conductive ink 102.

The upper enhanced ink region 104b may have a different potential than the conductive ink 102 due to the extra thickness of the enhanced ink layer 104. However, because there is no electric field in the lower enhanced ink region 104a, particles from the conductive ink 102 are unable to travel through the lower enhanced ink region 104a to reach the upper enhanced ink region 104b. The extra thickness of the enhanced ink layer 104 ensures that at least the upper enhanced ink region 104a acts as a moisture barrier and a metal particle barrier for the conductive ink 102. Like the embodiment shown in FIGS. 3 and 4, an optional overcoat layer (not shown) may be applied to the enhanced ink layer 104 to protect the enhanced ink layer 104 from scratching.

As a result, incorporating enhanced ink into a cross-over structure minimizes or eliminates failures due to migration of metal particles from the conductive ink trace forming the link between vias. The moisture resistance and metal particle resistance of the enhanced ink layer, along with its mild electrical conductivity, allow the enhanced ink to server as both a barrier and as a voltage potential equalizer. These properties minimize or eliminate moisture contamination of the conductive ink and/or electric fields around the conductive ink, thereby eliminating the causes of conductive ink migration. Although the examples above focus on a single-sided circuit board, the inventive concepts can be incorporated into any printed circuit board (e.g., both single and double-sided boards).

By using the enhanced ink to eliminate moisture and/or positive electric fields around the conductive ink path, the invention prevents short circuits from occurring due to migration of the conductive ink through the undercoat and/or overcoat layers.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A printed circuit board having a first via and a second via, comprising:

a conductive ink layer that forms a conductive path between the first via and the second via; and an enhanced ink layer disposed above the conductive ink layer, wherein the enhanced ink layer has lower conductivity and higher moisture resistance than the conductive ink layer, wherein the enhanced ink layer contains at least one of carbon and polytetrafluoroethylene (PTFE).

2. The printed circuit board of claim 1, wherein the conductive ink layer is formed as a cross-over path having edges, and wherein the enhanced ink layer extends past the edges of the cross-over path to completely cover the conductive ink layer.

3. The printed circuit board of claim 1, wherein the enhanced ink layer is disposed directly on the conductive ink layer.

4. The printed circuit board of claim 3, wherein the enhanced ink layer forms a lower region and an upper region, wherein at least the lower region has the same potential as the conductive ink layer.

5. The printed circuit board of claim 1, further comprising an overcoat layer disposed between the conductive ink layer and the enhanced ink layer.

6. The printed circuit board of claim 5, wherein the overcoat layer is made of an insulating material.

7. A printed circuit board having a first via, a second via, and a conductive trace between the first via and the second via, comprising:

an insulating undercoat layer disposed on top of the conductive trace;

a conductive ink layer that forms a conductive path between the first via and the second via; and an enhanced ink layer disposed above the conductive ink layer, wherein the enhanced ink layer has lower conductivity and higher moisture resistance than the conductive ink layer, wherein the enhanced ink layer contains at least one of carbon and polytetrafluoroethylene (PTFE).

8. The printed circuit board of claim 7, wherein the enhanced ink layer is disposed directly on the conductive ink layer.

9. The printed circuit board of claim 8, further comprising an insulating overcoat layer disposed on the enhanced ink layer.

10. The printed circuit board of claim 8, wherein the enhanced ink layer forms a lower region and an upper region, wherein at least the lower region has the same potential as the conductive ink layer.

11. The printed circuit board of claim 7, further comprising an insulating overcoat layer disposed between the conductive ink layer and the enhanced ink layer.

\* \* \* \* \*